United States Patent
Ho et al.

(10) Patent No.: US 10,410,695 B2
(45) Date of Patent: Sep. 10, 2019

(54) MEMORY STORAGE APPARATUS AND OPERATING METHOD THEREOF

(71) Applicant: Winbond Electronics Corp., Taichung (TW)

(72) Inventors: Wen-Chiao Ho, Taichung (TW); Pil-Sang Ryoo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/869,092

(22) Filed: Jan. 12, 2018

(65) Prior Publication Data

US 2018/0342272 A1    Nov. 29, 2018

(30) Foreign Application Priority Data

May 24, 2017   (CN) .......................... 2017 1 0372748

(51) Int. Cl.
   *G11C 5/06*    (2006.01)
   *G11C 7/12*    (2006.01)
   *G11C 7/22*    (2006.01)
   *G11C 8/08*    (2006.01)
   *G11C 8/10*    (2006.01)

(52) U.S. Cl.
   CPC ............... *G11C 7/12* (2013.01); *G11C 7/22* (2013.01); *G11C 8/08* (2013.01); *G11C 8/10* (2013.01); *G11C 2207/2281* (2013.01)

(58) Field of Classification Search
   CPC .... G11C 7/12; G11C 7/22; G11C 8/08; G11C 8/10; G11C 2207/2281
   USPC .................................................. 365/63, 203
   See application file for complete search history.

(56) References Cited

U.S. PATENT DOCUMENTS

| | | |
|---|---|---|
| 5,007,023 A | 4/1991 | Kim et al. |
| 5,768,199 A | 6/1998 | Inoue |
| 6,034,884 A * | 3/2000 | Jung ............. G11C 11/22 365/145 |
| 7,333,371 B2 | 2/2008 | Hosono |
| 7,668,011 B2 | 2/2010 | Kye et al. |

(Continued)

FOREIGN PATENT DOCUMENTS

| | | |
|---|---|---|
| CN | 103811073 | 5/2014 |
| JP | S62143289 | 6/1987 |
| JP | S63266689 | 11/1988 |

(Continued)

OTHER PUBLICATIONS

"Office Action of Taiwan Counterpart Application," dated Feb. 12, 2018, p. 1-p. 5.

*Primary Examiner* — Huan Hoang
(74) *Attorney, Agent, or Firm* — JCIPRNET

(57) ABSTRACT

A memory storage apparatus including a plurality of word lines, a plurality of bit lines, a memory cell array, and a memory controller is provided. The memory cell array includes a plurality of memory cells. The memory cells are configured to store data. Each of the memory cells is coupled to the corresponding word line and the corresponding bit line. The memory controller is configured to perform a read operation to the memory cell array. The memory controller performs a pre-charge operation to part or all of the bit lines when the memory controller enables the word lines. In addition, an operating method of a memory storage apparatus is also provided.

20 Claims, 8 Drawing Sheets

(56) References Cited

U.S. PATENT DOCUMENTS

2010/0054045 A1   3/2010  Ho et al.
2016/0064091 A1   3/2016  Shin

FOREIGN PATENT DOCUMENTS

| | | |
|---|---|---|
| JP | H0273594 | 3/1990 |
| JP | H0982090 | 3/1997 |
| JP | H09265780 | 10/1997 |
| JP | H09265781 | 10/1997 |
| JP | H10275489 | 10/1998 |
| TW | 200841341 | 10/2008 |

* cited by examiner

MEMORY STORAGE APPARATUS AND OPERATING METHOD THEREOF

CROSS-REFERENCE TO RELATED APPLICATION

This application claims the priority benefit of China application serial no. 201710372748.8, filed on May 24, 2017. The entirety of the above-mentioned patent application is hereby incorporated by reference herein and made a part of this specification.

BACKGROUND OF THE INVENTION

1. Field of the Invention

The invention relates to an electronic apparatus and an operating method thereof. More particularly, the invention relates to a memory storage apparatus and an operating method thereof.

2. Description of Related Art

In a memory storage apparatus, such as a non-volatile memory apparatus, a signal transmission interface between the memory storage apparatus and a memory controller is mainly used for performing a clock-based signal transmitting operation. Thereby, the signal transmitting operation between the memory storage apparatus and the memory controller can be more smoothly leveraging clock dependency. Moreover, for costs reduction and less pin count in chip packaging, the memory storage apparatus is required to perform signal transmitting operation with the memory controller on clock basis.

Along with the development of memory storage apparatus and requirements from users, the clock rate is developed to be faster and faster. Nevertheless, if the reading speed of the memory storage apparatus can not be enhanced accordingly, the development of the clock rate is likely to encounter bottleneck. In existing technology, much time is needed when performing a pre-charge operation to bit lines in order to complete the reading operation; and it thus can be seen that the development of the clock rate is to be limited if the reading speed fails to be enhanced.

SUMMARY OF THE INVENTION

The invention provides a memory storage device and an operating method thereof which is equipped with fast reading speed and can be operated at higher clock rate.

A memory storage apparatus provided by an embodiment of the invention includes a plurality of word lines, a plurality of bit lines, a memory cell array, and a memory controller. The memory cell array includes a plurality of memory cells. The memory cells are configured to store data. Each of the memory cells is coupled to the corresponding word line and the corresponding bit line. The memory controller is configured to perform a read operation to the memory cell array. When the memory controller enables the word lines, the memory controller performs a pre-charge operation to part or all of the bit lines.

An operating method of the memory storage apparatus provided by an embodiment of the invention includes: receiving and decoding a sector signal so as to perform the read operation to a sector in the memory cell array; and enabling the word lines and performing the pre-charge operation to part or all of the bit lines when enabling the word lines.

To sum up, in the embodiments of the invention, the memory controller performs the pre-charge operation to part or all of the bit lines when the memory controller enables the word lines, so as to accelerate the reading speed of the memory storage apparatus.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Herein, several embodiments of the invention are introduced to describe the invention; however the invention is not limited by the embodiments. Suitable combinations among the embodiments are also allowed. The term "coupled to" used throughout the embodiments (including claims) may refer to any direct and indirect connection means. For example, if a first device is described as being coupled to a second device in the embodiments, the sentence should be explained as the first device may be connected to the second device directly, or the first device may, through any other device or through certain connection means, be connected to the second device indirectly. In addition, the word "signal" may refer to at least one current, voltage, electric charge, temperature, data, electromagnetic wave, or any other signal or signals.

Figure 1:
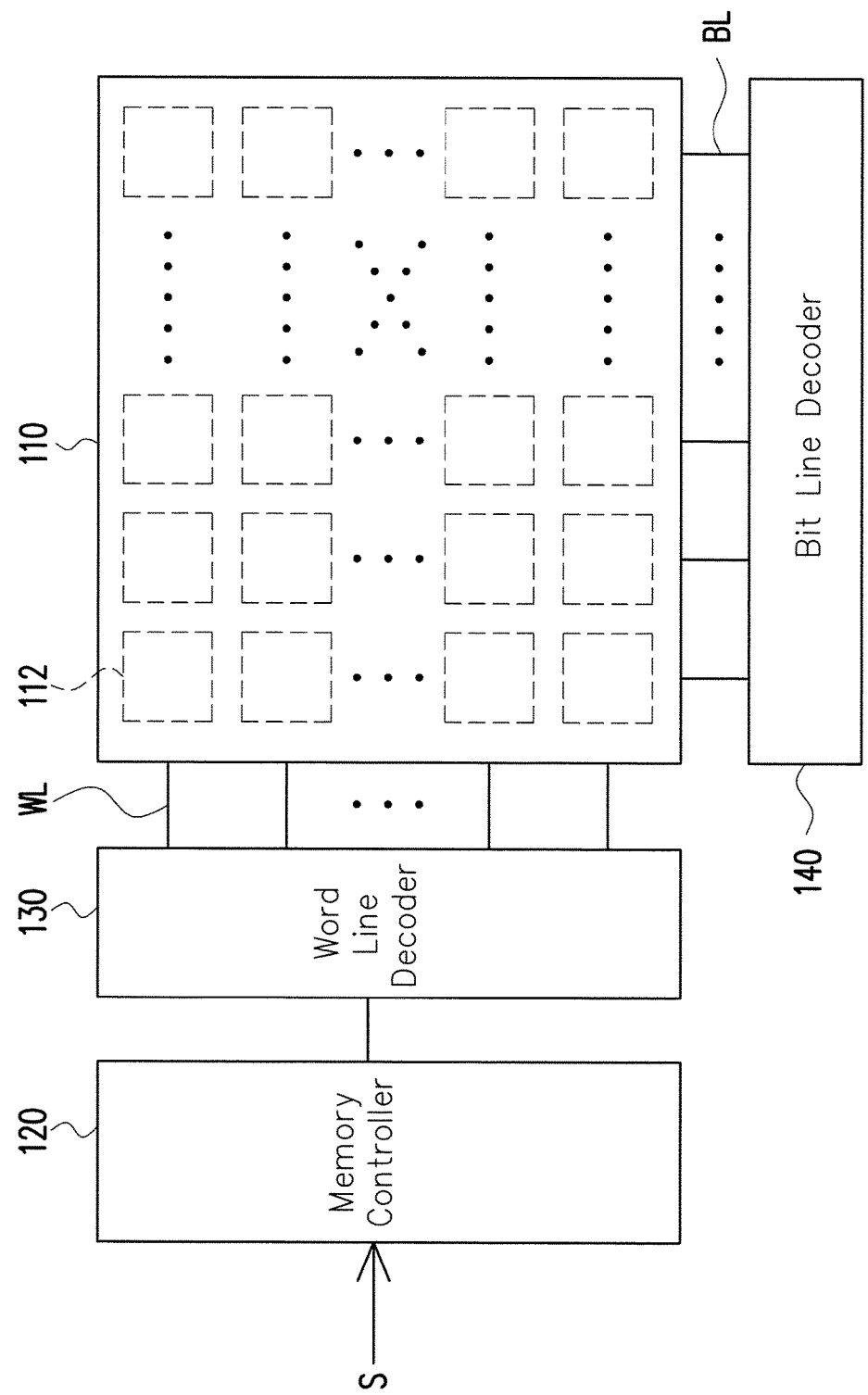
FIG. 1 is a schematic diagram illustrating a memory storage apparatus according to an embodiment of the invention.
Figure 2:
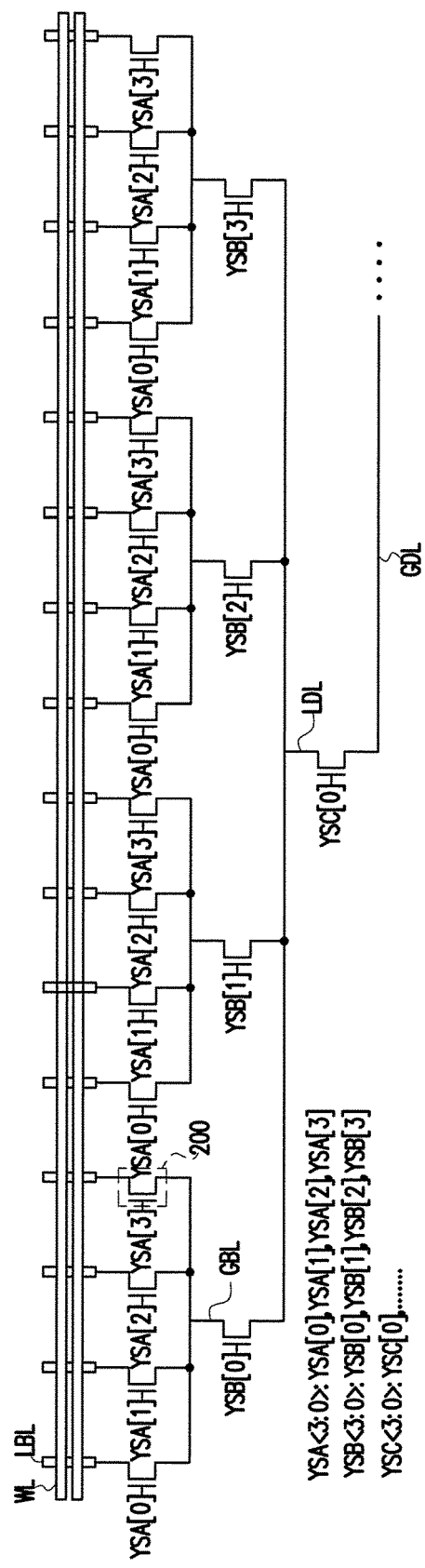
FIG. 2 is a schematic circuit diagram illustrating the combination of the bit lines and the channel gate transistors of FIG. 1.

FIG. 1 is a schematic diagram illustrating a memory storage apparatus according to an embodiment of the invention. FIG. 2 is a schematic circuit diagram illustrating the combination of the bit lines and the channel gate transistors of FIG. 1 and including a plurality of pre-charge paths.

Referring to FIG. 1 and FIG. 2, a memory storage apparatus 100 provided by the present embodiment includes a plurality of word lines WL, a plurality of bit lines BL, a memory cell array 110, a memory controller 120, a word line decoder 130, and a bit line decoder 140. In the present embodiment, the memory cell array 110 includes a plurality of memory cells 112. The memory cells 112 are configured to store data. Each of the memory cells 112 is coupled to the corresponding word line WL and the corresponding bit line BL. The memory controller 120 is configured to perform a read operation to the memory cell array 110. In the present embodiment, the memory controller 120 receives and decodes a sector signal S, so as to accordingly select a target sector in the memory cell array 110 for performing the read operation.

In the present embodiment, the memory storage apparatus 100 may include other suitable circuits configured to collaboratively control data access, for example, a sector decoder and a sensing amplifier circuit. In the present embodiment, various circuits of the memory storage apparatus 100 may respectively be implemented by any one of suitable circuit structures in the art, and the invention is not limited thereto. People having ordinary skill in the art may acquire sufficient teachings, suggestions, and other details related to the circuit structures and operating methods.

Generally, when the memory controller 120 performs the read operation to the memory cell array 110, the process can be divided into several steps most of the time, for example, including a command input, a word line address input, and a bit line address input steps. After the memory controller 120 performs the read operation to the memory cell array 110, data stored in the memory cell array 112 can be sequentially read out. The bit line address input step includes a pre-charge operation, a sensing operation, and a data output operation most of the time.

Referring to FIG. 2, in the present embodiment, when the memory controller 120 performs the pre-charge operation to the memory cell array 110, the memory controller 120 controls the bit line decoder 140 to decode bit line address signals YSC<3:0>, YSB<3:0>, and YSA<3:0>, so as to select a target bit line and perform the pre-charge operation. In the present embodiment, the bit lines BL include a plurality of local bit lines LBL and a plurality of global bit lines GBL. Data lines include a plurality of local data lines LDL and a plurality of global data lines GDL. Channel gate transistors 200 are disposed on each of the bit lines and the data lines. In the present embodiment, the memory controller 120 chooses to turn on or turn off the channel gate transistors 200 through a hierarchical method, so as to select the target bit line to be pre-charged. For example, in the present embodiment, the bit line address signals YSC<3:0>, YSB<3:0>, and YSA<3:0> are, for example, decoded in sequence. Thereby, the channel gate transistor (e.g., the transistor controlled by the bit line address signal YSC[0]) controlled by the bit line address signal YSC<3:0> may be turned on or turned off. Next, the channel gate transistors (e.g., the transistors controlled by the bit line address signals YSB[0], YSB[1], YSB[2], and YSB[3]) controlled by the bit line address signal YSB<3:0> may be turned on or turned off. Afterwards, the channel gate transistors (e.g., the transistors controlled by the bit line address signals YSA[0], YSA[1], YSA[2], and YSA[3]) controlled by the bit line address signal YSA<3:0> may be turned on or turned off. Thereby, when being decoded through the foregoing sequence, the corresponding channel gate transistors are turned on. As such, pre-charge paths of the global data lines GDL, the local data lines LDL, the global bit lines GBL, and the local bit lines LBL can be established, and the target bit line to be pre-charged can be selected. The target bit line is, for example, any one of the local bit lines LBL. In an embodiment, another hierarchical method includes that, for example, the bit line address signals YSA<3:0>, YSB<3:0>, and YSC<3:0> are decoded in sequence. Thereby, the channel gate transistors 200 are turned on from the local bit lines LBL, the global bit lines GBL, and the local data lines LDL in sequence, and that the pre-charge paths are established. After the pre-charge paths are established, the target bit line is charged. Thereby, when the data is read, a cell current may establish a preset voltage, to be compared with a reference voltage, at an input terminal of the sensing amplifier circuit (not shown), and that the sensing amplifier circuit can determine whether the data stored by the cell is bit 0 or bit 1.

In FIG. 1 and FIG. 2, numbers and locations of the word lines, the bit lines, the data lines, the memory cells, and the channel gate transistors are mere exemplary and should not be construed as limitations of the invention.

Generally, regardless of the hierarchical methods, when the bit line address signals are decoded, the pre-charge operation requires much time, a reading speed of the memory storage apparatus 100 is thus limited. Thereby, in the present embodiment, when the memory controller 120 enables the word lines WL, or when the memory controller 120 decodes the sector signal, the memory controller 120 first performs the pre-charge operation to part or all of the bit lines for reducing a pre-charge time of the bit lines when decoding the bit line address signals, so as to enhance the reading speed of the memory storage apparatus 100. Several embodiments are described below to illustrate the operating method of the memory storage apparatus of the invention.

Figure 3:
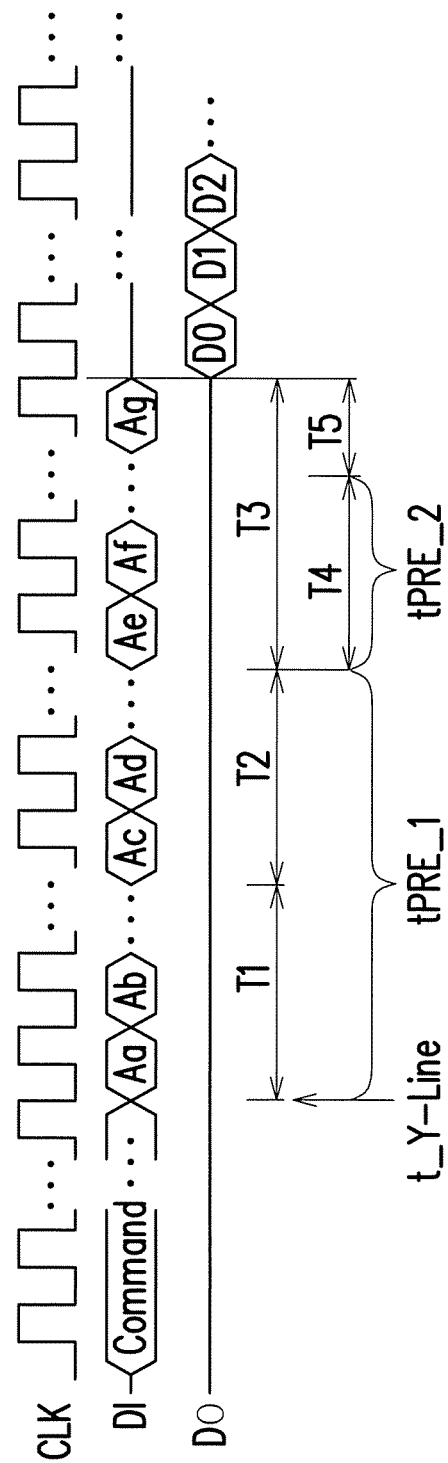
FIG. 3 illustrates a schematic timing diagram of each of signals when a memory storage apparatus performs a read operation according to an embodiment of the invention.

FIG. 3 illustrates a schematic timing diagram of each of signals when a memory storage apparatus performs a read operation according to an embodiment of the invention. Referring from FIG. 1 to FIG. 3, signals illustrated in FIG. 3 include a clock signal CLK, an input signal DI, and an output signal DO. In the present embodiment, the memory controller 120 receives a read command to perform a read operation to the memory cell array 110.

In the present embodiment, in a decoding period T1, the memory controller 120 decodes the sector signal S (e.g., including sector addresses Aa and Ab), so as to obtain an address of the target sector and to select the target sector to perform the read operation in the memory cell array 110. In a decoding period T2, the memory controller 120 controls the word line decoder 130 to decode word line addresses Ac and Ad for selecting a target word line. A decoding period T3 includes decoding periods T4 and T5. In the decoding period T4, the memory controller 120 controls the bit line decoder 140 to decode bit line addresses Ae and Af for selecting a target bit line. During the decoding period T5, the memory controller 120 decodes a sensor address Ag for selecting a target sensor to sense the cell current, so as to determine a bit status of data stored by the cell.

In the present embodiment, the memory controller 120 begins to perform the pre-charge operation to all of the bit lines at a starting time point t_Y-Line and completes the pre-charge operation when the decoding period T2 ends, and thereby, a first pre-charge period tPRE_1 includes the decoding periods T1 and T2. In other words, in the present embodiment, when decoding the sector signal S and enabling the word lines WL, the memory controller 120 simultaneously performs the pre-charge operation to the local bit lines LBL, the global bit lines GBL, the local data lines LDL, and the global data lines GDL. Next, in a second pre-charge period tPRE_2, according to decoding results of the bit line addresses Ae and Af, a non-selected bit line and data lines are discharged, and a voltage of a selected bit line (e.g., a target local bit line) is kept unchanged and driven before a sensing period. Thereby, in the decoding periods T1 and T2, the pre-charge operation is first performed to all of the bit lines, and thus, a time period of the second pre-charge period tPRE_2 is reduced and the reading speed is increased compared to existing technology.

In the present embodiment, when decoding the sector signal S and enabling the word lines WL, the memory controller 120 simultaneously performs the pre-charge operation to all of the bit lines, but the invention is not limited thereto. In an embodiment, in the first pre-charge period tPRE_1, the memory controller 120 performs the pre-charge operation to, for example, part of the bit lines. For example, when decoding the sector signal S and enabling the word lines WL, the memory controller 120 simultaneously pre-charges the global bit lines GBL, the local data lines LDL, and the global data lines GDL. In other words, except for the local bit lines LBL, the global bit lines GBL, the local data lines LDL, and the global data lines GDL are pre-charged in the first pre-charge period tPRE_1. Thereby, in the decoding periods T1 and T2, the pre-charge operation is first performed to part of the bit lines except for the local bit lines LBL, and thus, the time period of the second pre-charge period tPRE_2 is reduced and the reading speed is increased compared to existing technology.

Figure 4:
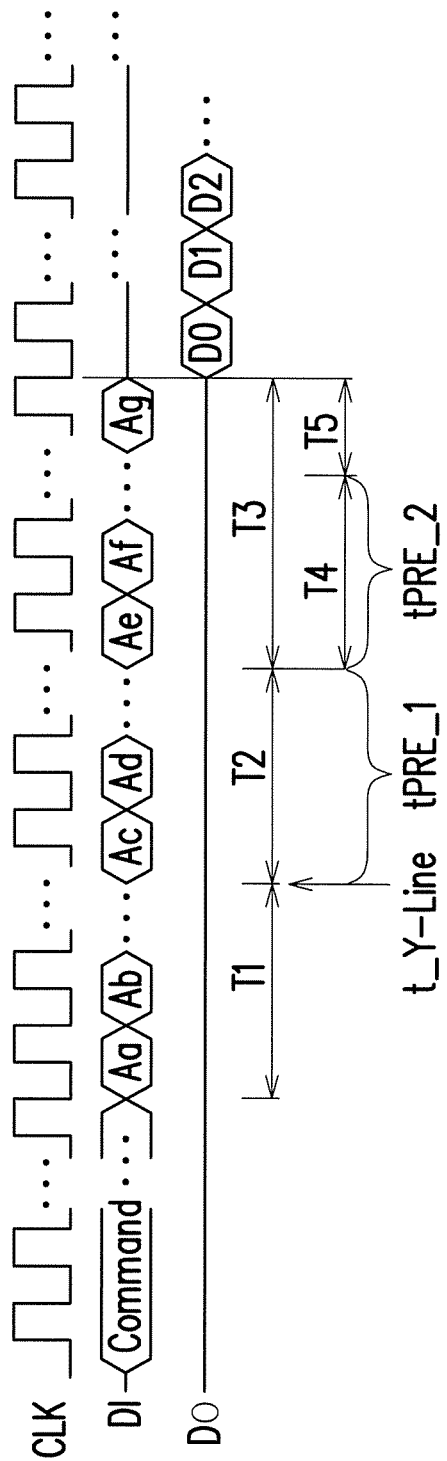
FIG. 4 illustrates a schematic timing diagram of each of signals when a memory storage apparatus performs a read operation according to another embodiment of the invention.

FIG. 4 illustrates a schematic timing diagram of each of signals when a memory storage apparatus performs a read operation according to another embodiment of the invention. Referring to FIG. 1, FIG. 2, and FIG. 4, a pre-charge operating method of the present embodiment is similar to that of the embodiment of FIG. 3, a difference therebetween includes that, for example, when enabling the word lines WL, the memory controller 120 simultaneously performs the pre-charge operation to all of the bit lines.

Specifically, in the present embodiment, the memory controller 120 begins to perform the pre-charge operation to all of the bit lines at the starting time point t_Y-Line and completes the pre-charge operation when the decoding period T2 ends, and thereby, the first pre-charge period tPRE_1 includes the decoding period T2. In other words, in the present embodiment, when enabling the word lines WL, the memory controller 120 simultaneously performs the pre-charge operation to the local bit lines LBL, the global bit lines GBL, the local data lines LDL, and the global data lines GDL. Next, in the second pre-charge period tPRE_2, according to the decoding results of the bit line addresses Ae and Af, the non-selected bit line and data lines are discharged, and the voltage of the selected bit line (e.g., the target local bit line) is kept unchanged and driven before the sensing period. Thereby, the pre-charge operation is first performed to all of the bit lines when the word lines WL are simultaneously enabled (the decoding period T2), and thus, the time period of the second pre-charge period tPRE_2 is reduced and the reading speed is increased compared to existing technology.

In the present embodiment, when enabling the word lines WL, the memory controller 120 simultaneously performs the pre-charge operation to all of the bit lines, but the invention is not limited thereto. In an embodiment, in the first pre-charge period tPRE_1, the memory controller 120 performs the pre-charge operation to, for example, part of the bit lines. For example, when enabling the word lines WL, the memory controller 120 simultaneously pre-charges the global bit lines GBL, the local data lines LDL, and the global data lines GDL. In other words, except for the local bit lines LBL, the global bit lines GBL, the local data lines LDL, and the global data lines GDL are pre-charged in the first pre-charge period tPRE_1. Thereby, the pre-charge operation is first performed to part of the bit lines except for the local bit lines LBL when the word lines WL are simultaneously enabled (the decoding period T2), and thus, the time period of the second pre-charge period tPRE_2 is reduced and the reading speed is increased compared to existing technology.

Figure 5:
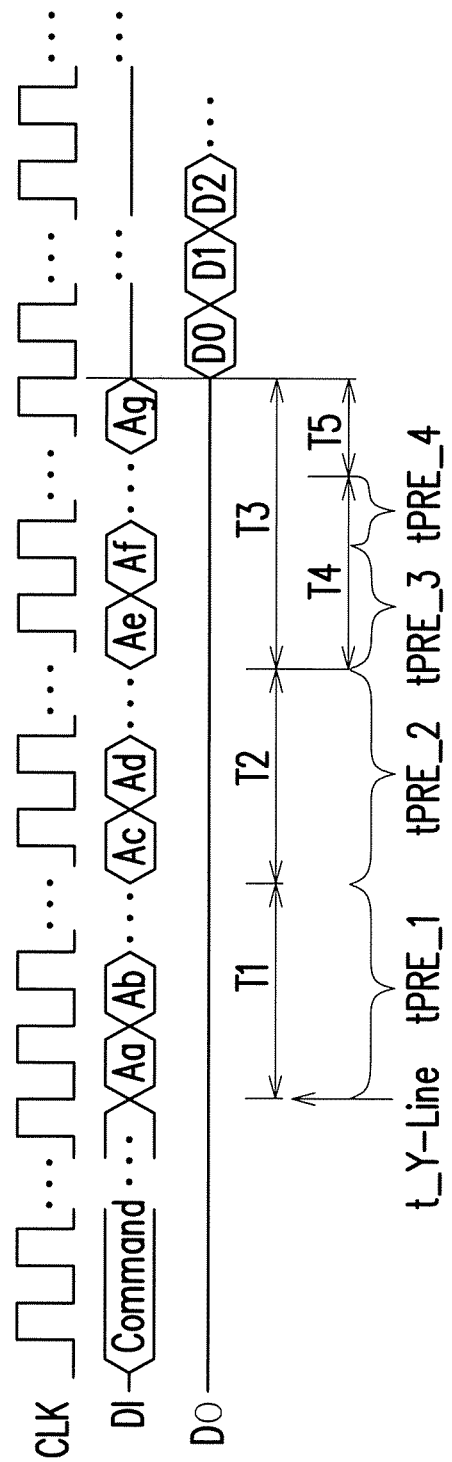
FIG. 5 illustrates a schematic timing diagram of each of signals when a memory storage apparatus performs is a read operation according to another embodiment of the invention.

FIG. 5 illustrates a schematic timing diagram of each of signals when a memory storage apparatus performs a read operation according to another embodiment of the invention. Referring to FIG. 1, FIG. 2, and FIG. 5, in the present embodiment, except for the local data lines LBL, the global bit lines GBL, the local data lines LDL, and the global data lines GDL are pre-charged in the decoding periods T1 and T2. Moreover, in the decoding period T2, the local bit lines LBL are isolated. For example, in the present embodiment, when the word lines WL are enabled (in the decoding period T2), the channel gate transistor controlled by the bit line address signal YSA<3:0> is, for example, turned off, so as to isolate signal lines such as the local bit lines LBL and the global bit lines GBL. Next, in a third pre-charge period tPRE_3, the non-selected bit line and the data lines are discharged, and in a fourth pre-charge period tPRE_4, the selected bit line (e.g., the target local bit line) is pre-charged.

Thereby, in the present embodiment, in the decoding periods T1 and T2, the pre-charge operation is first performed to part of the bit lines except for the local bit lines LBL, and thus, a total time period of the third pre-charge period tPRE_3 and the fourth pre-charge period tPRE_4 is reduced and the reading speed is increased compared to existing technology.

Figure 6:
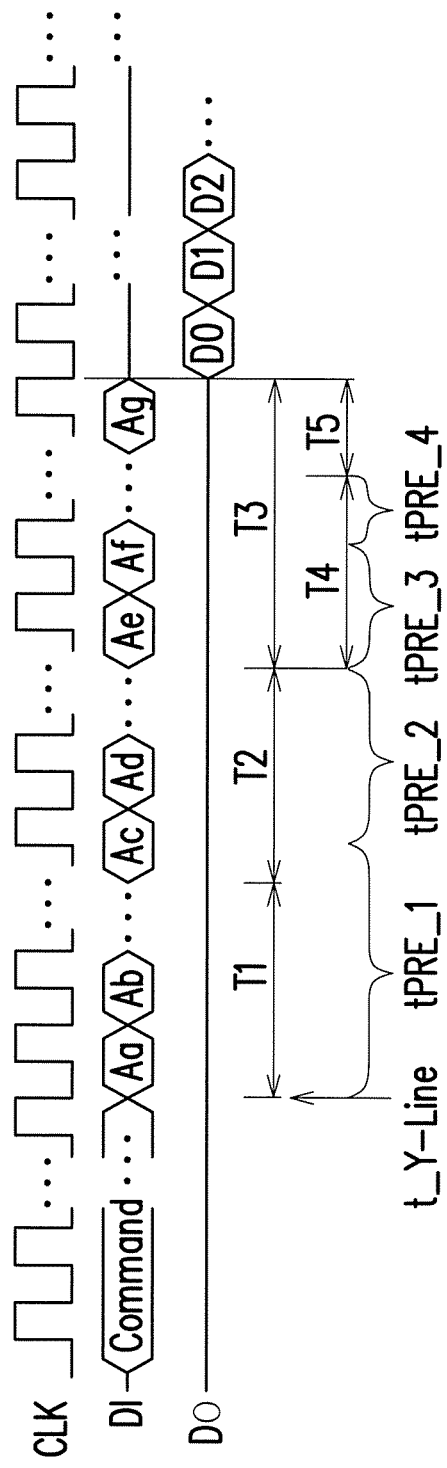
FIG. 6 illustrates a schematic timing diagram of each of signals when a memory storage apparatus performs a read operation according to another embodiment of the invention.

FIG. 6 illustrates a schematic timing diagram of each of signals when a memory storage apparatus performs a read operation according to another embodiment of the invention. Referring to FIG. 1, FIG. 2, and FIG. 6, a pre-charge operating method of the present embodiment is similar to that of the embodiment of FIG. 5, a difference therebetween includes that, for example, the memory controller 120 performs the pre-charge operation to part of the bit lines in the first pre-charge period tPRE_1. Moreover, in the present embodiment, the first pre-charge period tPRE_1 includes the decoding period T1 and part of the adjacent decoding period T2.

Specifically, in the present embodiment, except for the local bit lines LBL, the global bit lines GBL, the local data lines LDL, and the global data lines GDL are pre-charged in the first pre-charge period tPRE_1. Moreover, in the second pre-charge period tPRE_2, the local bit lines LBL are isolated. Here, the second pre-charge period tPRE_2 includes another part of the decoding period T2. For example, in the present embodiment, when the word lines WL are enabled (in the second pre-charge period tPRE_2), the channel gate transistor controlled by the bit line address signal YSA<3:0> is, for example, turned off, so as to isolate the signal lines such as the local bit lines LBL and the global bit lines GBL. Next, in the third pre-charge period tPRE_3, the non-selected bit line and the data lines are discharged, and in the fourth pre-charge period tPRE_4, the selected bit line (e.g., the target local bit line) is pre-charged.

Thereby, in the present embodiment, the pre-charge operation is first performed to part of the bit lines except for the local bit lines LBL in the first pre-charge period tPRE_1, and thus, the total time period of the third pre-charge period tPRE_3 and the fourth pre-charge period tPRE_4 is reduced and the reading speed is increased compared to existing technology.

Figure 7:
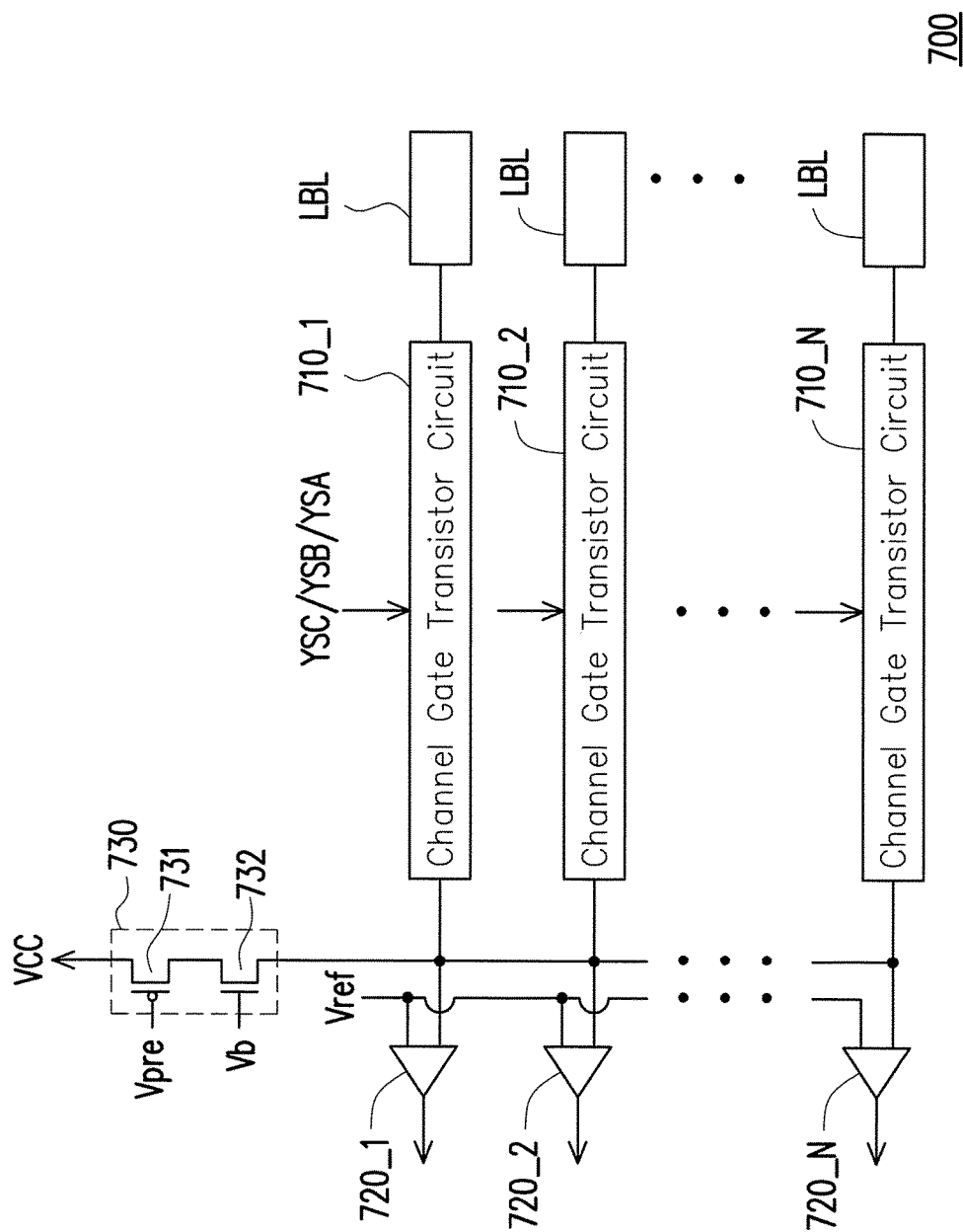
FIG. 7 is a schematic diagram illustrating a pre-charge circuit according to an embodiment of the invention.

FIG. 7 is a schematic diagram illustrating a pre-charge circuit according to an embodiment of the invention. Referring to FIG. 2 and FIG. 7, in the present embodiment, a pre-charge circuit 700 includes a plurality of channel gate transistor circuits 710_1 and 710_2 to 710_N, a plurality of sensing amplifier circuits 720_1 and 720_2 to 720_N, and a pre-charge transistor circuit 730, and N is a positive integer greater than 2. In the present embodiment, each of the channel gate transistor circuits is controlled by the address signals YSA, YSB, and YSC and includes a plurality of the channel gate transistors 200. When transistors in the channel gate transistor circuits are turned on, the pre-charge path can be established, and thereby, the cell current can flow from the pre-charge circuit path to the corresponding bit line.

In the present embodiment, the pre-charge transistor circuit 730 includes a first transistor 731 and a second transistor 732. A first terminal of the first transistor 731 is coupled to a system voltage VCC. A second terminal of the first transistor 731 is coupled to a second terminal of the second transistor 732. A control terminal of the first transistor 731 is coupled to a pre-charge signal Vpre. The second terminal of the second transistor 732 is coupled to the corresponding channel gate transistor circuit. A control terminal of the second transistor 732 is coupled to a voltage signal. In the present embodiment, in the decoding period T3, the pre-charge signal Vpre is configured to cut off the pre-charge path. A voltage signal Vb is a specific voltage configured to limit a source terminal of the second transistor 732 to a charge potential of the bit lines. In an embodiment, the pre-charge transistor circuit 730 can be implemented in a sensing amplifier circuit as well, which should not be construed as a limitation to the invention.

Figure 8:
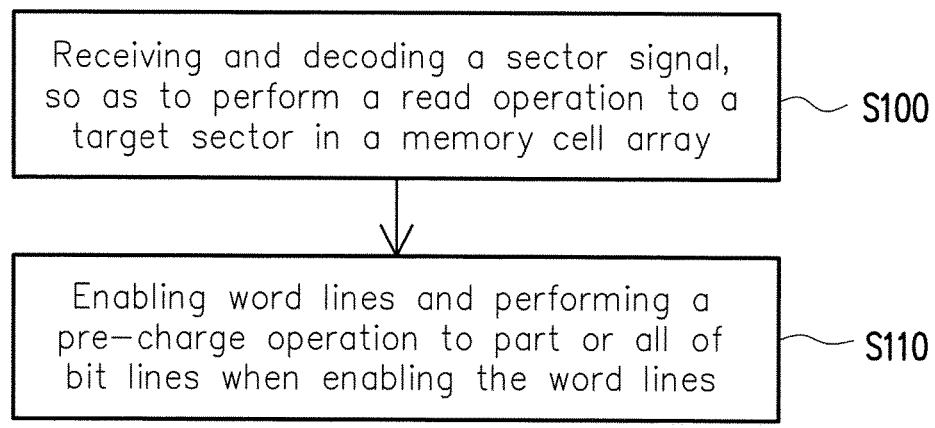
FIG. 8 is a flowchart illustrating steps of an operating method of a memory storage apparatus according to an embodiment of the invention.

FIG. 8 is a flowchart illustrating steps of an operating method of a memory storage apparatus according to an embodiment of the invention. Referring to FIG. 1, FIG. 2, and FIG. 8, the operating method of the memory storage apparatus provided by the present embodiment is at least suitable for the memory storage apparatus 100 of FIG. 1 and FIG. 2, which should not be construed as limitation to the invention. The memory storage apparatus 100 of FIG. 1 and FIG. 2 is taken for example, in step S100, the memory storage apparatus 100 receives and decodes the sector signal S, so as to perform the read operation to the target sector in the memory cell array 110. In step S110, the memory storage apparatus 100 enables the word lines WL and performs the pre-charge operation to part or all of the bit lines when enabling the word lines WL. In addition, for the operating method of the memory storage apparatus provided by the embodiments of the invention, enough teaching, suggestion, and implementation illustration are obtained from the above embodiments of FIG. 1 to FIG. 7, and that detailed descriptions are not further provided hereinafter.

In view of the foregoing, in the embodiments of the invention, when enabling the word lines and/or decoding the sector signal, the memory controller performs the pre-charge operation to part or all of the bit lines and data lines, so as to accelerate the reading speed of the memory storage apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory storage apparatus, comprising:
    a plurality of word lines and a plurality of bit lines;
    a memory cell array, comprising a plurality of memory cells and configured to store data, wherein each of the memory cells is coupled to the corresponding word line and the corresponding bit line;
    a memory controller, configured to perform a read operation to the memory cell array, wherein the memory controller performs a pre-charge operation to part or all of the bit lines when the memory controller enables the word lines; and
    a plurality of data lines coupled to the bit lines, wherein the bit lines comprise a plurality of local bit lines and a plurality of global bit lines, and the data lines comprise a plurality of local data lines and a plurality of global data lines, wherein the global bit lines, the local data lines, and the global data lines are pre-charged when the memory controller performs the pre-charge operation to part of the bit lines.

2. The memory storage apparatus as claimed in claim 1, wherein the memory controller receives and decodes a sector signal, and the memory controller performs the pre-charge operation to part or all of the bit lines when the memory controller decodes the sector signal.

3. The memory storage apparatus as claimed in claim 1, wherein the local bit lines, the global bit lines, the local data lines, and the global data lines are pre-charged when the memory controller performs the pre-charge operation to all of the bit lines.

4. The memory storage apparatus as claimed in claim 1, wherein after the memory controller enables the word lines, a non-selected bit line of the bit lines is discharged.

5. The memory storage apparatus as claimed in claim 1, wherein after the memory controller enables the word lines, a voltage of a selected bit line of the bit lines is kept unchanged before a sensing period.

6. The memory storage apparatus as claimed in claim 1, wherein after the memory controller enables the word lines, a selected bit line of the bit lines is pre-charged.

7. The memory storage apparatus as claimed in claim 1, wherein the local bit lines are isolated when the memory controller enables the word lines.

8. The memory storage apparatus as claimed in claim 1, wherein the memory controller enables the word lines in a first decoding period, the memory controller decodes a sector signal in a second decoding period, and the memory controller performs the pre-charge operation to part of the bit lines in the first decoding period and part of the second decoding period.

9. The memory storage apparatus as claimed in claim 1, wherein the memory storage apparatus further comprises:
    a pre-charge circuit, configure to perform the pre-charge operation to part or all of the bit lines, wherein the pre-charge circuit comprises a plurality of channel gate transistor circuits, a plurality of sensing amplifier circuits, and a pre-charge transistor circuit,
    wherein each of the channel gate transistor circuits is coupled between the corresponding bit line and the corresponding sensing amplifier circuit and controlled by an address signal, and the pre-charge transistor circuit establishes a pre-charge path and a cell current flows from the pre-charge circuit path to the corresponding bit line when the address signal turns on the corresponding channel gate transistor circuit.

10. The memory storage apparatus as claimed in claim 9, wherein the pre-charge transistor circuit comprises:
- a first transistor, having a first terminal, a second terminal, and a control terminal, wherein the first terminal of the first transistor is coupled to a system voltage, and the control terminal of the first transistor is coupled to a pre-charge signal; and
- a second transistor, having a first terminal, a second terminal, and a control terminal, wherein the first terminal of the second transistor is coupled to the second terminal of the first transistor, the second terminal of the second transistor is coupled to the corresponding channel gate transistor circuit, and the control terminal of the second transistor is coupled to a voltage signal,
- wherein the pre-charge signal cuts off the pre-charge path in a third decoding period.

11. The memory storage apparatus as claimed in claim 1, wherein the memory controller performs the pre-charge operation to part or all of the bit lines before the memory controller decodes a bit line address to select a target bit line of the bit lines.

12. An operating method of a memory storage apparatus, wherein the memory storage apparatus comprises a memory cell array, a plurality of word lines, and a plurality of bit lines, and the operating method comprises:
- receiving and decoding a sector signal so as to perform a read operation to a sector in the memory cell array; and
- enabling the word lines and performing a pre-charge operation to part or all of the bit lines when enabling the word lines,
- wherein the memory storage apparatus further comprises a plurality of data lines, the bit lines comprise a plurality of local bit lines and a plurality of global bit lines, and the data lines comprise a plurality of local data lines and a plurality of global data lines, wherein the global bit lines, the local data lines, and the global data lines are pre-charged when performing the pre-charge operation to part of the bit lines.

13. The operating method of the memory storage apparatus as claimed in claim 12, further comprising:
- performing the pre-charge operation to part or all of the bit lines when decoding the sector signal.

14. The operating method of the memory storage apparatus as claimed in claim 12, wherein the local bit lines, the global bit lines, the local data lines, and the global data lines are pre-charged when performing the pre-charge operation to all of the bit lines.

15. The operating method of the memory storage apparatus as claimed in claim 12, further comprising:
- performing a discharge operation to a non-selected bit line of the bit lines after the step of enabling the word lines.

16. The operating method of the memory storage apparatus as claimed in claim 12, further comprising:
- keeping a voltage of a selected bit line of the bit lines unchanged before a sensing period after the step of enabling the word lines.

17. The operating method of the memory storage apparatus as claimed in claim 12, further comprising:
- performing the pre-charge operation to a selected bit line of the bit lines after the step of enabling the word lines.

18. The operating method of the memory storage apparatus as claimed in claim 12, wherein the local bit lines are isolated when enabling the word lines.

19. The operating method of the memory storage apparatus as claimed in claim 12, wherein the word lines are enabled in a first decoding period, a sector signal is decoded in a second decoding period, and the pre-charge operation is performed to part of the bit lines in the first decoding period and part of the second decoding period.

20. The operating method of the memory storage apparatus as claimed in claim 12, further comprising:
- enabling the word lines and performing the pre-charge operation to part or all of the bit lines before decoding a bit line address to select a target bit line of the bit lines.

* * * * *